(12) United States Patent
Chen et al.

(10) Patent No.: US 11,342,522 B2
(45) Date of Patent: May 24, 2022

(54) WHITE-LIGHT QLED COMPONENT, BACKLIGHT MODULE AND ILLUMINATION APPARATUS

(71) Applicant: NATIONAL TSING HUA UNIVERSITY, Hsinchu (TW)

(72) Inventors: Hsueh-Shih Chen, Hsinchu (TW); Shuan Yang, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 55 days.

(21) Appl. No.: 16/920,152

(22) Filed: Jul. 2, 2020

(65) Prior Publication Data
US 2021/0320271 A1  Oct. 14, 2021

(30) Foreign Application Priority Data
Apr. 8, 2020  (TW) ................. 109111810

(51) Int. Cl.
*H01L 51/50* (2006.01)
*F21V 8/00* (2006.01)
*H01L 51/52* (2006.01)

(52) U.S. Cl.
CPC .......... *H01L 51/502* (2013.01); *G02B 6/0073* (2013.01); *H01L 51/5056* (2013.01); *H01L 51/5072* (2013.01); *H01L 51/5088* (2013.01); *H01L 51/5237* (2013.01); *H01L 2251/5361* (2013.01)

(58) Field of Classification Search
CPC ............... H01L 51/502; H01L 51/5088; H01L 51/5036
See application file for complete search history.

(56) References Cited

U.S. PATENT DOCUMENTS

2012/0113672 A1\* 5/2012 Dubrow .................... F21V 9/30
362/602

\* cited by examiner

*Primary Examiner* — Anthony Ho

(57) ABSTRACT

A white-light QLED component, comprising: a transparent substrate, an anode layer, a HI layer, a HT layer, an emission layer, an ET layer, and a cathode layer. The emission layer is incorporated with a plurality of yellow QDs and a plurality of blue QDs, wherein the yellow QDs and the blue QDs have a mixing ratio in a range between 1:4 and 1:8. Experimental data have revealed that, a color temperature of a white light radiated from the white-light QLED component is modulatable by adjusting the weight percent of the yellow QDs in the emission layer, such that the QLED component can be decided to provide a cold white light, a pure white light or a warm white light. It can also control the white-light QLED component to optionally emit cold white light, pure white light or warm white light by modulating a bias voltage.

20 Claims, 16 Drawing Sheets

WHITE-LIGHT QLED COMPONENT, BACKLIGHT MODULE AND ILLUMINATION APPARATUS

BACKGROUND OF THE INVENTION

1. Field of the Invention

The present invention relates to the technology field of quantum dot light-emitting diode, and more particularly to a white-light QLED component, a backlight module using the white-light QLED component, and an illumination apparatus using the white-light QLED component.

2. Description of the Prior Art

Light plays an important role for a very long time in human life. Accompanying with the constant progresses of science and technology, LED (Light Emitting Diode) has been invented in 1970s. With the advantages of compact size, long lifetime, low breakage, low power consumption, and no toxic pollution, LED is now broadly utilized in our daily life.

There are two ways to achieve a white-light LED component. One is to let a red LED die, a green LED die and a blue LED die be simultaneously packaged so as to form the white-light LED component. The white-light LED component including the red LED die, the green LED die and the blue LED die has a principal advantage of high color rendering index (CRI), but also exhibits paramount shortcomings of complex topology of control circuit and high manufacturing cost. Another one is to let a blue-light (or purple-light) LED die and an encapsulation material that is doped with phosphor be simultaneously packaged so as to form the white-light LED component. The white-light LED component merely including a single LED die is also called phosphor-converted LED (PC-LED). When the PC-LED is driven to work normally, the blue-light LED die emits a blue light to excite the phosphor, such that a red light and a green light radiated from the light-excited phosphor. As a result, a white light mixed by the red light, the green light and the blue light is radiated from the PC-LED.

Quantum dots light-emitting diode (QLED) is a new form of solid-state lighting technology based on nanoparticle, and its structure is similar to that of the conventional organic light-emitting diode (OLED). QLEDs are promising light source for application in the fabrication of a QLED display device. Nowadays, there are many reports for consolidating so as to show both high brightness and high external quantum efficiency of the QLED. Accordingly, manufactures of solid-state lighting devices have made great efforts to make inventive research and development in QLED element and/or component. For example, China patent publication No. CN103427030A has disclosed a white light QLED element.

FIG. 1 shows a cross-sectional diagram of the white-light QLED element discloses by China patent publication No. CN103427030A. As FIG. 1 shows, the white-light QLED element 1' comprises a cathode layer 1C', an electron transport layer 1ET', a first emission layer EM1', a spacing layer 1B', a second emission layer EM2', a hole transport layer 1HT', a hole injection layer 1HI', and an anode layer 1A'. In which, the emission layer EM1' is incorporated with a plurality of green quantum dots (QDs), and the emission layer EM2' is incorporated with a plurality of red QDs.

As described in more detail below, after applying a bias voltage between the anode layer 1A' and the cathode layer 1C, a white light is radiated from the first emission layer EM1', the spacing layer 1B', and the second emission layer EM2' of the white-light QLED element 1'. It is a pity that, however, after a backlight module using the white-light QLED elements 1' is applied in an LCD device, the LCD device can merely exhibit a best color gamut of 72% NTSC. On the other hand, after taking the white-light QLED element 1' as a principal light source of an illumination apparatus, statistical data have evidenced that there is still room for improvement in an illumination light radiated from the illumination apparatus.

From above descriptions, it is understood that there is still room for improvement in the conventional QLED element. In view of that, inventors of the present application have made great efforts to make inventive research and eventually provided a white-light QLED component, a backlight module using the white-light QLED component, and an illumination apparatus using the white-light QLED component.

SUMMARY OF THE INVENTION

A first objective of the present invention is to disclose a white-light QLED component, comprising: a transparent substrate, an anode layer, a hole injection layer, a hole transport layer, an emission layer, an electron transport layer, and a cathode layer. Particularly, the emission layer is designed to be incorporated with a plurality of yellow quantum dots (QDs) and a plurality of blue QDs, wherein the yellow QDs and the blue QDs have a mixing ratio in a range between 1:4 and 1:8. Experimental data have revealed that, a color temperature of a white light radiated from the white-light QLED component is modulatable by adjusting the content (weight percent) of the yellow QDs in the emission layer, such that the QLED component can be decided to provide a cold white light, a pure white light or a warm white light. On the other hand, it is able to control the white-light QLED component to emit a cold white light, a pure white light or a warm white light by modulating a bias voltage.

A second objective of the present invention is to disclose a backlight module, which comprises a light guide plate and N number of the forgoing white-light QLED components. Therefore, by applying the backlight module in a flat-plane display device, the flat-plane display device is able to exhibit an advantage of wide color gamut.

A third objective of the present invention is to disclose an illumination apparatus that uses at least one of the forgoing white-light QLED component as a light source thereof. Particularly, it is able to control the illumination apparatus to emit a cold white light, a pure white light or a warm white light by modulating a driving voltage signal that is applied to the at least one white-light QLED component.

For achieving the forgoing first objective of the present invention, a first embodiment of the white-light QLED component is provided, comprising:

a transparent substrate;
an anode layer, being formed on the transparent substrate;
a hole injection layer, being formed on the anode layer;
a hole transport layer, being formed on the hole injection layer;
an emission layer, being formed on the hole transport layer, and being incorporated with a plurality of yellow quantum dots (QDs) and a plurality of blue QDs; wherein the yellow QDs and the blue QDs have a first mixing ratio in a range between 1:4 and 1:8;
an electron transport layer, being formed on the emission layer; and a cathode layer, being formed on the electron transport layer.

In the first embodiment, the emission layer can be further incorporated with a plurality of red QDs and a plurality of green QDs, and red QDs, the green QDs, and the blue QDs having a second mixing ratio in a range between 2:1:3 and 3.8:1:5.5.

For achieving the forgoing first objective of the present invention, a second embodiment of the white-light QLED component is provided, comprising:
a transparent substrate;
an anode layer, being formed on the transparent substrate;
a hole injection layer, being formed on the anode layer;
a hole transport layer, being formed on the hole injection layer;
an emission layer, being formed on the hole transport layer, and being incorporated with a plurality of red quantum dots (QDs), a plurality of green QDs and a plurality of blue QDs; wherein the red QDs, the green QDs and the blue QDs have a first mixing ratio in a range between 2:1:3 and 3.8:1:5.5;
an electron transport layer, being formed on the emission layer; and a cathode layer, being formed on the electron transport layer.

In the second embodiment, the emission layer can be further incorporated with a plurality of yellow QDs, and the yellow QDs and the blue QDs having a second mixing ratio in a range between 1:4 and 1:8.

In one practicable embodiment, the white-light QLED component can be taken as a light source for application in an illumination apparatus.

In one practicable embodiment, at least one of the white-light QLED component and a light guide plate can be assembled to form a backlight module, such that the backlight module can be further applied in a flat-plane display device.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a white-light QLED component, a backlight module using the white-light QLED component, and an illumination apparatus using the white-light QLED component, embodiments of the present invention will be described in detail with reference to the attached drawings hereinafter.

First Embodiment of White-Light QLED Element

Figure 1:
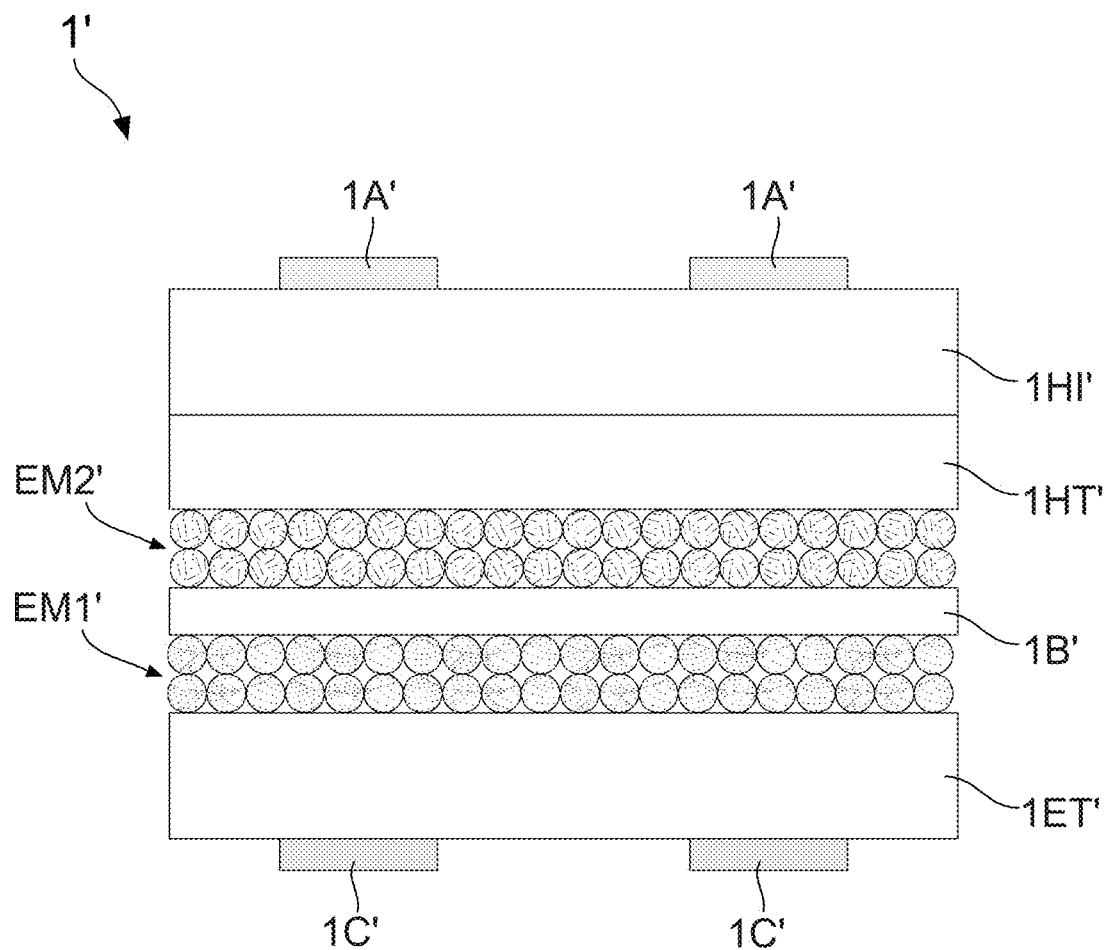
FIG. 1 shows a cross-sectional diagram of a conventional white-light QLED element discloses by China patent publication No. CN103427030A.
Figure 2:
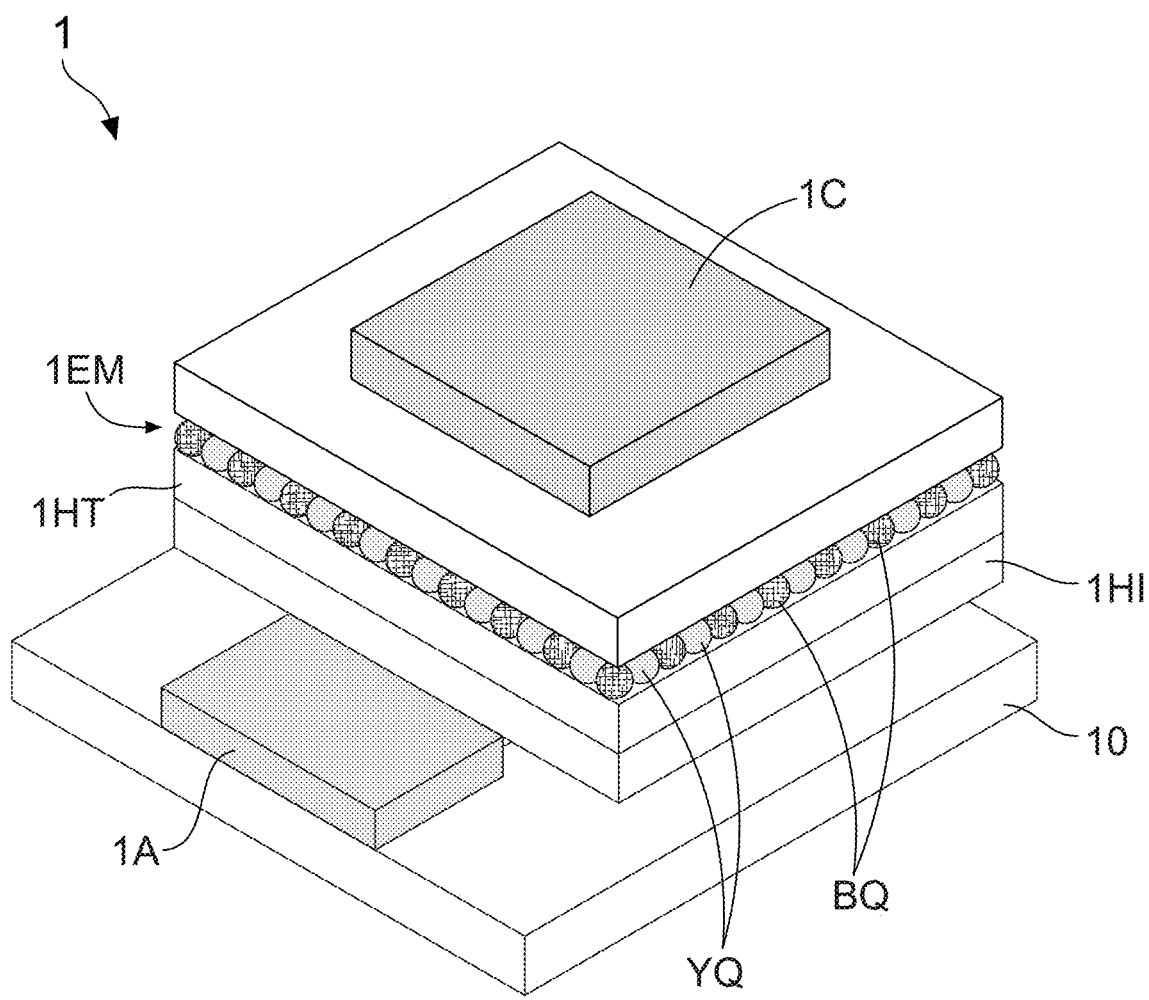
FIG. 2 shows a schematic stereo diagram of a white-light QLED element according to the present invention.
Figure 3:
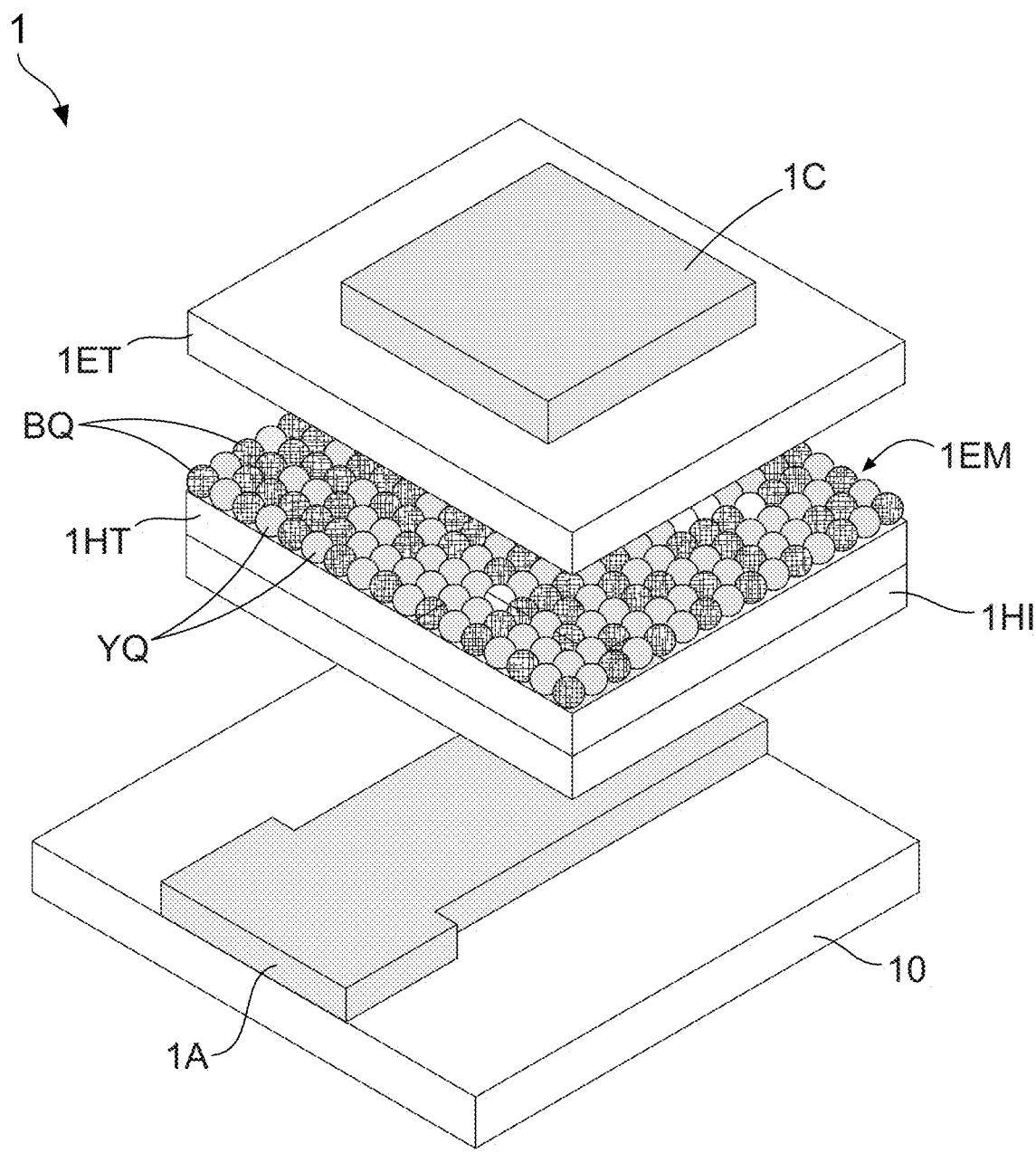
FIG. 3 shows an exploded view of the white-light QLED element according to the present invention.

With reference to FIG. 2, there is shown a schematic stereo diagram of a white-light QLED element according to the present invention. Moreover, FIG. 3 illustrates an exploded view of the white-light QLED element according to the present invention. As FIG. 2 and FIG. 3 show, the present invention discloses a white-light QLED element 1, comprising: a transparent substrate 10, an anode layer 1A formed on the transparent substrate 10, a hole injection layer 1HI formed on the anode layer 1A, a hole transport layer 1HT formed on the hole injection layer 1HI, an emission layer 1EM formed on the hole transport layer 1HT, an electron transport layer 1ET formed on the emission layer 1EM, and a cathode layer 1C formed on the electron transport layer 1ET.

In one practicable embodiment, a material for making the anode layer 1A is selected from the group consisting of nickel (Ni), platinum (Pt), vanadium (V), chromium (Cr), copper (Cu), zinc (Zn), gold (Au), fluorine-doped tin oxide (FTO), indium tin oxide (ITO), zinc oxide (ZnO), ZnO-doped gallium oxide (ZnO—$Ga_2O_3$), alumina-doped zinc oxide (ZnO—$Al_2O_3$), and tin oxide (SnO). Moreover, a material for making the hole injection layer 1HI is selected from the group consisting of poly(2,3-dihydrothieno-1,4-dioxin)-poly(styrenesulfonate) (PEDOT:PSS), poly-3-methylthiophene (PMeT), polypyrrole (PPy), and polyaniline (PANI).

On the other hand, a material for making the hole transport layer 1HT is selected from the group consisting of molybdenum oxide (MoO3), 2,2',7,7'-tetrakis[N,N-di(4-methoxyphenyl)amino]-9,9'-spirobifluorene (spiro-OMeTAD), poly(2,3-dihydrothieno-1,4-dioxin)-poly(styrenesulfonate) (PEDOT:PSS), N,N'-bis(3-methylphenyl)-N,N'-diphenylbenzidine (TPD), poly-TPD (PTPD), and poly (3-hexylthiophene-2,5-diyl) (P3HT). Moreover, a material for making the electron transport layer 1ET is selected from the group consisting of zinc oxide (ZnO), titanium oxide (TiO2), tris(8-hydroxyquinoline)aluminum (Alq3) and 2,2', 2"-(1,3,5-Benzinetriyl)-tris(1-phenyl-1-H-benzimidazole) (TPBi). In addition, a material for making the cathode layer 1C is selected from the group consisting of magnesium (Mg), calcium (Ca), titanium (Ti), indium (In), lithium (Li), aluminum (Al), silver (Ag), tin (An), compound of lithium fluoride (LiF) and (Al, and compound of LiF and Ca.

In the first embodiment, the emission layer 1EM formed between the hole transport layer 1HT and the electron transport layer 1ET is incorporated with a plurality of yellow quantum dots (QDs) YQ and a plurality of blue QDs BQ. It is worth further explaining that, a photoluminescence (PL) spectrum of the yellow QDs YQ reveals that a yellow light radiated from the yellow QDs YQ has a wavelength of 550±5 nm. Moreover, a PL spectrum of the blue QDs BQ indicates that a blue light emitted by the blue QDs BQ has a wavelength of 460±5 nm. According to the particular design of the present invention, the yellow QDs YQ and the blue QDs BQ have a mixing ratio in a range between 1:4 and 1:8. In other words, the yellow QDs are contained in the emission layer 1EM by a content (weight percent) of 11-20%, and the blue QDs are contained in the emission layer 1EM has a content of 89-80%. By such design, the emission layer 1EM of the white-light QLED 1 would emit a white light after a bias voltage is applied between the anode layer 1A and the cathode layer 1C.

Figure 4A:
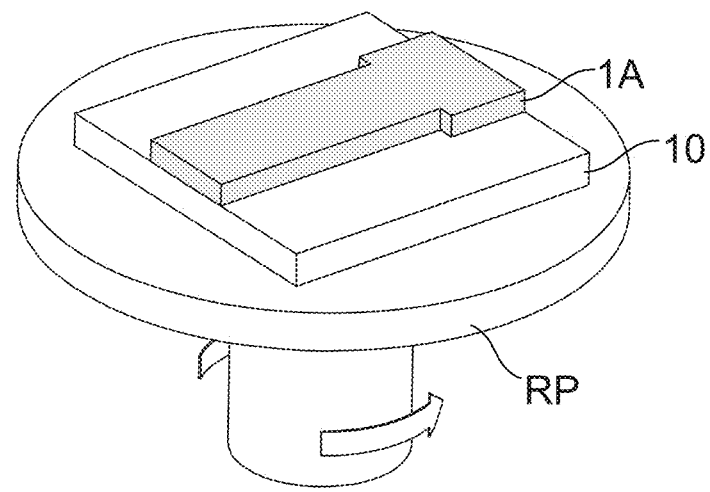
FIG. 4A to FIG. 4F show schematic diagrams for describing a manufacturing flow of the white-light QLED element.
Figure 4B:
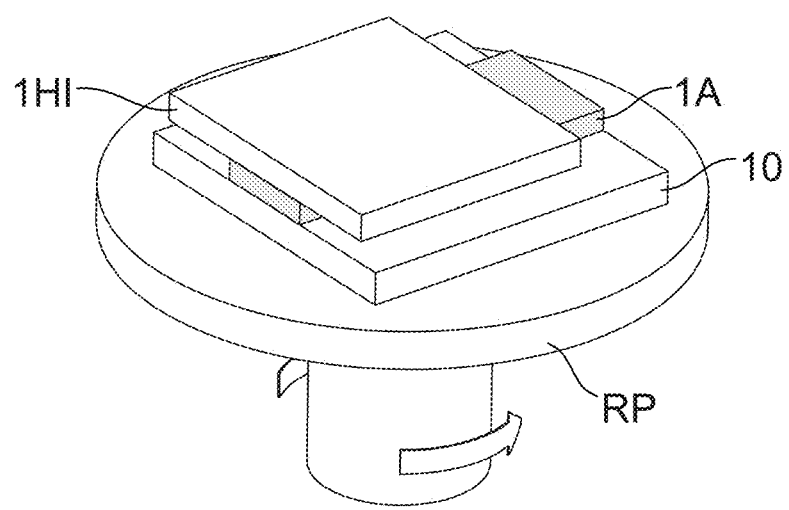
Figure 4C:
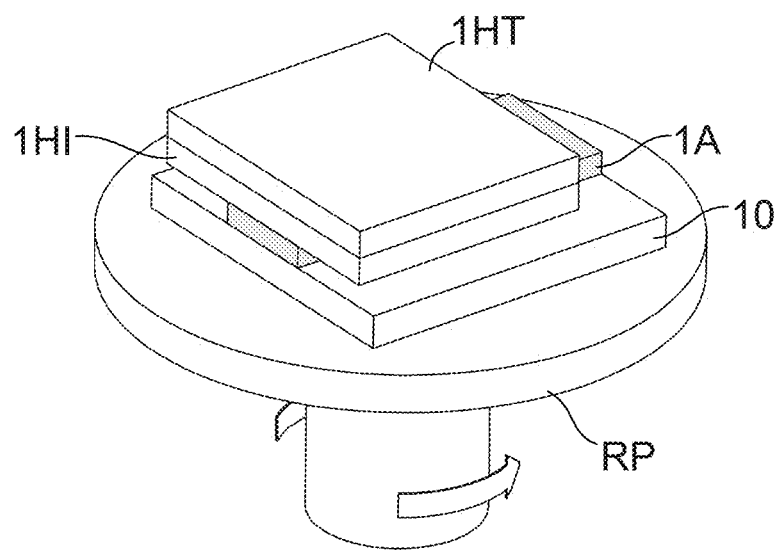
Figure 4D:
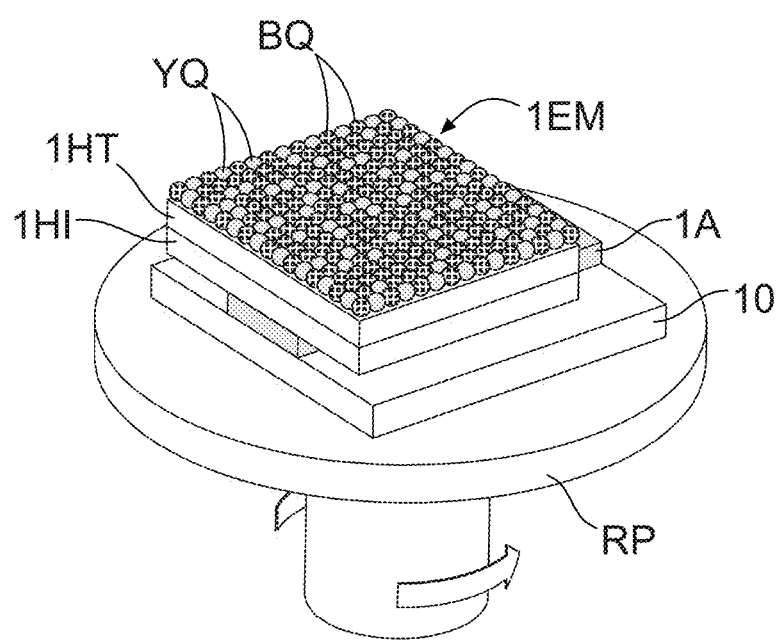
Figure 4E:
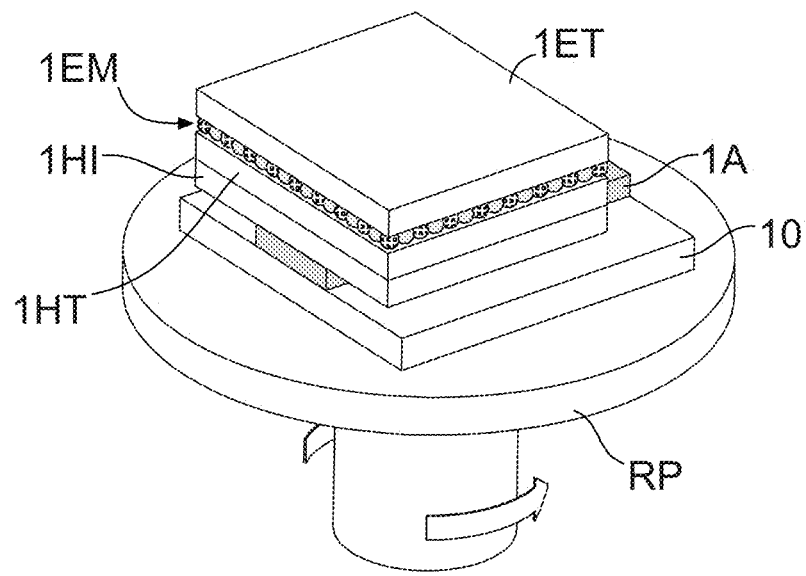
Figure 4F:
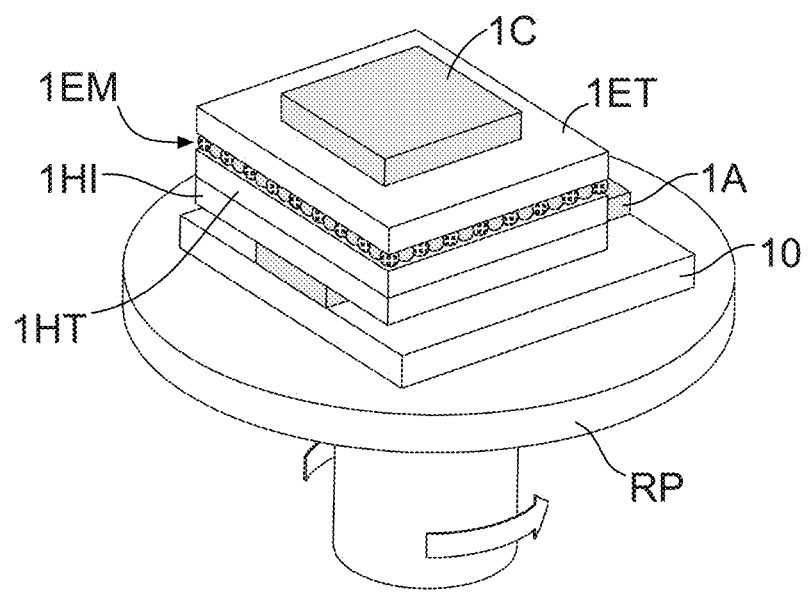

With reference from FIG. 4A to FIG. 4F, there are shown schematic diagrams for describing a manufacturing flow of the white-light QLED element 1 of the present invention. As FIG. 4A shows, the manufacturing flow is firstly to apply an ultraviolet irradiation to a transparent substrate 10 that is formed with an anode layer 1A thereon, and then to dispose the transparent substrate 10 on a rotary platform RP. Next, as FIG. 4B and FIG. 4C shows, a hole injection layer 1HI and a hole transport layer 1HT are sequentially formed on the anode layer 1A by using spin coating technology. Subsequently, as FIG. 4D shows, an emission layer 1EM that is incorporated with a plurality of yellow QDs YQ and a plurality of blue QDs BQ is formed on the hole transport layer 1HT by using spin coating technology. After that, as FIG. 4E shows, an electron transport layer 1ET is formed on the emission layer 1EM by using spin coating technology. Consequently, as FIG. 4F shows, a cathode layer 1C is deposited on the electron transport layer 1ET by using evaporation technology.

For verifying whether the white-light QLED element 1 having the structure shown as FIG. 2 emits a white light or not, there are five samples of the white-light QLED element 1 adopted for completing a first experiment. The five samples are listed in following table (1).

TABLE 1

| Sample No. | Content of QDs in emission layer |
| --- | --- |
| 1 | 12% yellow QDs and 88% blue QDs |
| 2 | 13% yellow QDs and 87% blue QDs |
| 3 | 14% yellow QDs and 86% blue QDs |
| 4 | 15% yellow QDs and 85% blue QDs |
| 5 | 16% yellow QDs and 84% blue QDs |

Figure 5:
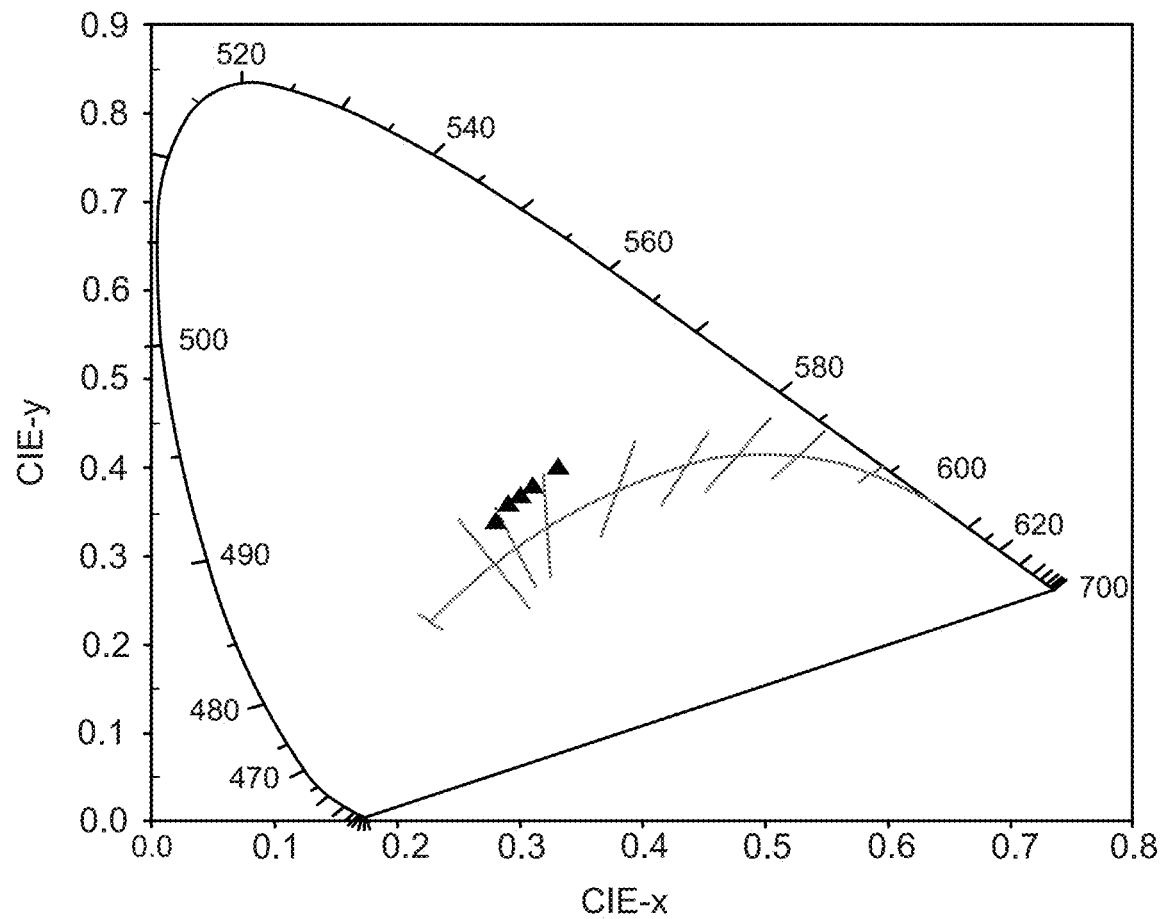
FIG. 5 shows a CIE 1931 chromaticity diagram for showing chromaticity coordinates of five samples of the white-light QLED element.

With reference to FIG. 5, there is shown a CIE 1931 chromaticity diagram for showing chromaticity coordinates of the five samples of the white-light QLED element. In the first experiment, sample No. 1 of the white-light QLED element 1 is designed to have 12% yellow QDs and 88% blue QDs in the emission layer 1EM thereof. From FIG. 5, it is found that the sample No. 1 can indeed emit a white light with a chromaticity coordinate (0.28, 0.34), and the white light is classified as a cold white light because of having a color temperature greater than 6500K. In the first experiment, moreover, sample No. 5 of the white-light QLED element 1 is designed to have 16% yellow QDs and 84% blue QDs in the emission layer 1EM thereof. From FIG. 5, it is found that the sample No. 5 can indeed emit a white light with a chromaticity coordinate (0.325, 0.4), and the white light is classified as a pure white light because of having a color temperature that is greater than 5500K but smaller than 6500K. Therefore, experimental data have evidenced that, a color temperature (CT) of a white light radiated from the white-light QLED element 1 is modulatable by adjusting the content (weight percent) of the yellow QDs in the emission layer 1EM, such that the QLED element can be decided to provide a cold white light (CT>6500K), a pure white light (5500K<CT<6500K) or a warm white light (2500K<CT<5500K).

For further verifying whether the white-light QLED element 1 having the structure shown as FIG. 2 emits a white light or not, the forgoing sample No. 3 of the white-light QLED element 1 is adopted for completing a second experiment. In the second experiment, the sample No. 3 is applied with four different bias voltages that are listed in following table (2).

TABLE 2

| Condition No. of the bias voltage | Level of the bias voltage |
| --- | --- |
| 1 | 3 V |
| 2 | 5 V |
| 3 | 7 V |
| 4 | 9 V |

Figure 6:
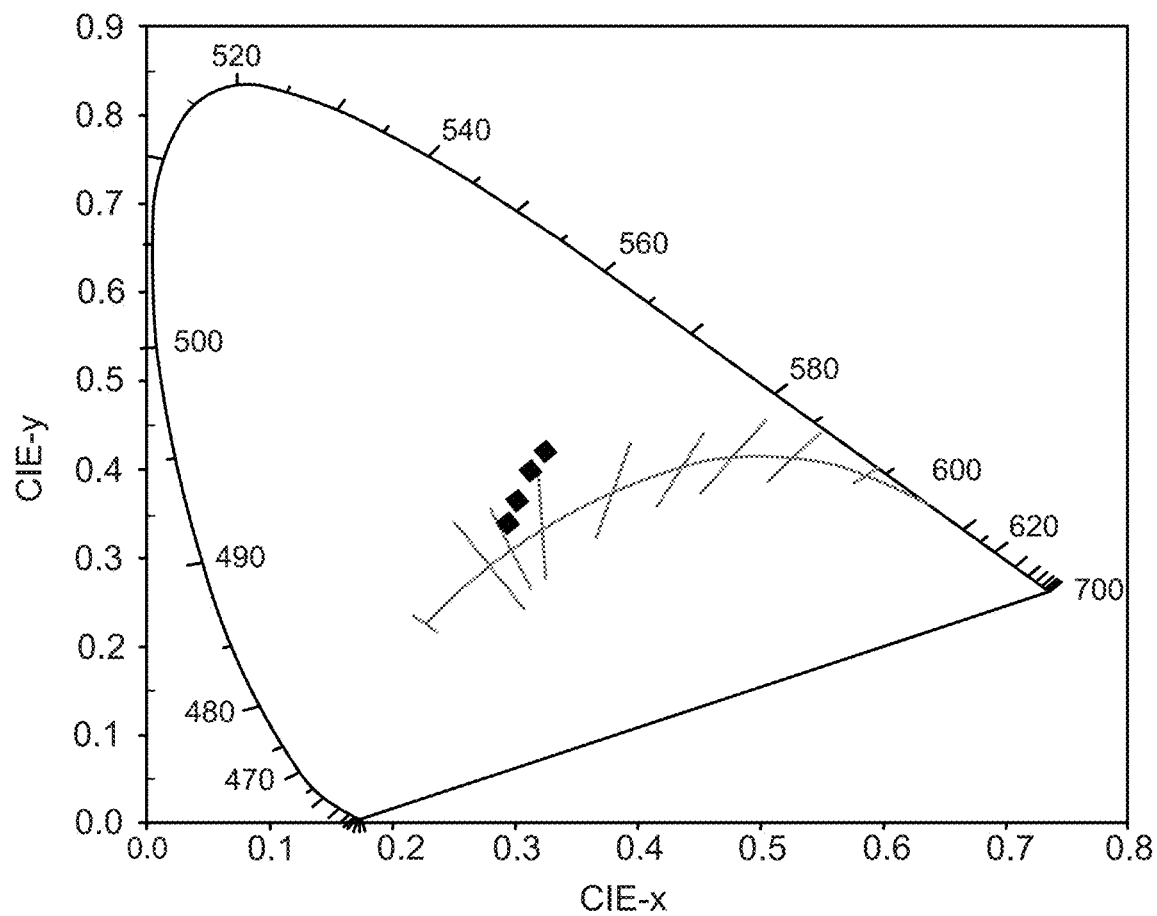
FIG. 6 shows a CIE 1931 chromaticity diagram for showing chromaticity coordinates of the white light that is radiated from white-light QLED element receiving four different bias voltages.

With reference to FIG. 6, there is shown a CIE 1931 chromaticity diagram for showing chromaticity coordinates of the white light that is radiated from white-light QLED element receiving four different bias voltages. Data of FIG. 6 have revealed that, after applying a 3V bias voltage to the sample No. 3, a white light with a chromaticity coordinate (0.295, 0.34) is radiated from the sample No. 3, and the white light is classified as a cold white light because of having a color temperature greater than 6500K. Moreover, data of FIG. 6 have also indicated that, in case of a 3V bias voltage being applied to the sample No. 3, a white light having a chromaticity coordinate (0.322, 0.42) is radiated from the sample No. 3, and the white light is classified as a pure white light because of having a color temperature greater than 5500K but less than 6500K. As a result, experimental data have evidenced that, it can also control the white-light QLED element 1 of the present invention to optionally emit cold white light, pure white light or warm white light by modulating the level (intensity) of the bias voltage.

Applications of the White-Light QLED Element

Figure 7:
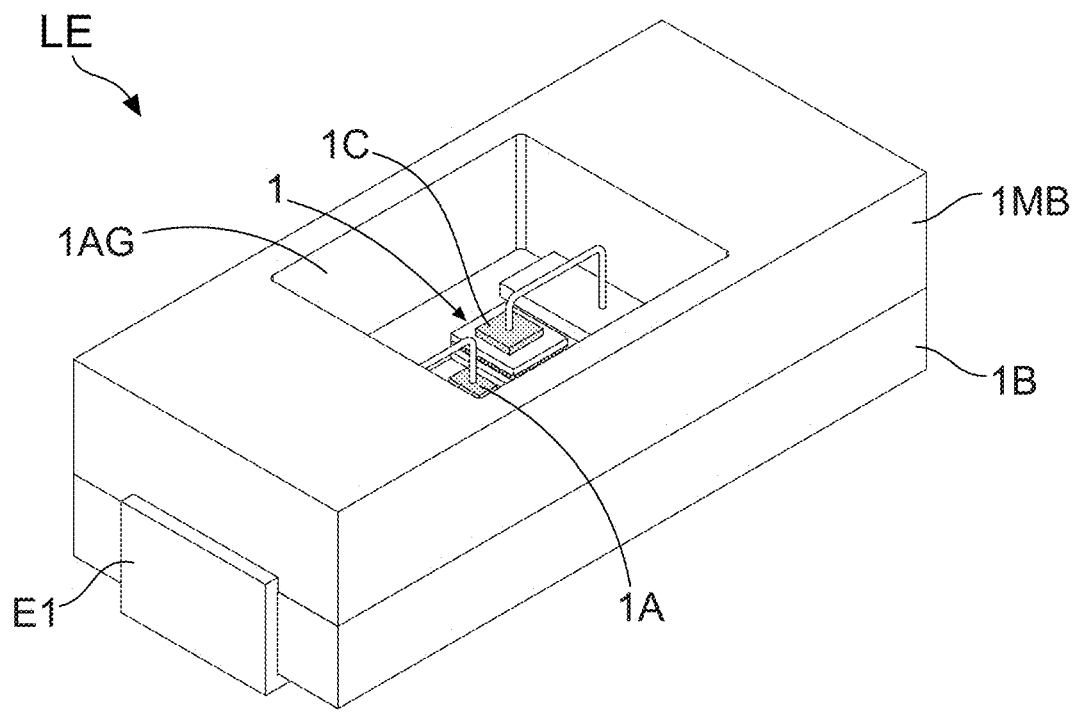
FIG. 7 shows a schematic stereo diagram of a white-light QLED component including the forgoing white-light QLED element according to the present invention.
Figure 8:
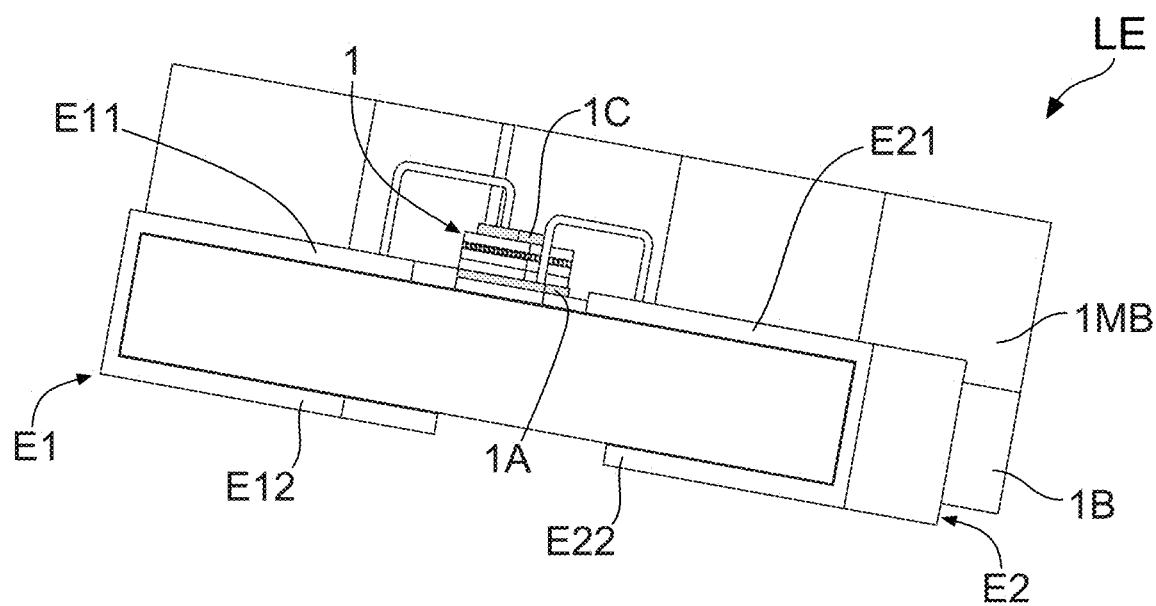
FIG. 8 shows a cross-sectional view of the white-light QLED component.

With reference to FIG. 7, there is shown a schematic stereo diagram of a white-light QLED component LE including the forgoing white-light QLED element 1 according to the present invention. Moreover, FIG. 8 illustrates a cross-sectional view of the white-light QLED component LE. From FIG. 7 and FIG. 8, it is understood that the white-light QLED element 1 having the structure shown as FIG. 2 is processed to form the white-light QLED component LE through electronic package. The white-light QLED component LE comprises: the white-light QLED element 1 of the present invention, a base 1B, a main body MB, and a lead frame consisting of a first electrode unit E1 and a second electrode unit E2.

As described in more detail below, the main body 1MB is disposed on the base 1B, and has an accommodation recess 1AG. The first electrode unit E1 is embedded in the main body 1MB, and has a first electrical portion E11 and a first welded portion E12. It is worth noting that, the first electrical portion E11 is exposed out of the main body 1MB through the accommodation recess 1AG, and the first welded portion E12 is protruded so as to be exposed out of the main body 1MB. On the other hand, the second electrode unit E2 is embedded in the main body 1MB, and has a second electrical portion E21 and a second welded portion E22. From FIG. 7 and FIG. 8, it is known that the second electrical portion E21 is exposed out of the main body 1MB through the accommodation recess 1AG, and the second welded portion E22 is protruded so as to be exposed out of the main body 1MB. Moreover, the anode layer 1A is electrically connected to the first electrical portion E11, and the cathode layer 1C is electrically connected to the second electrical portion E21.

Figure 9:
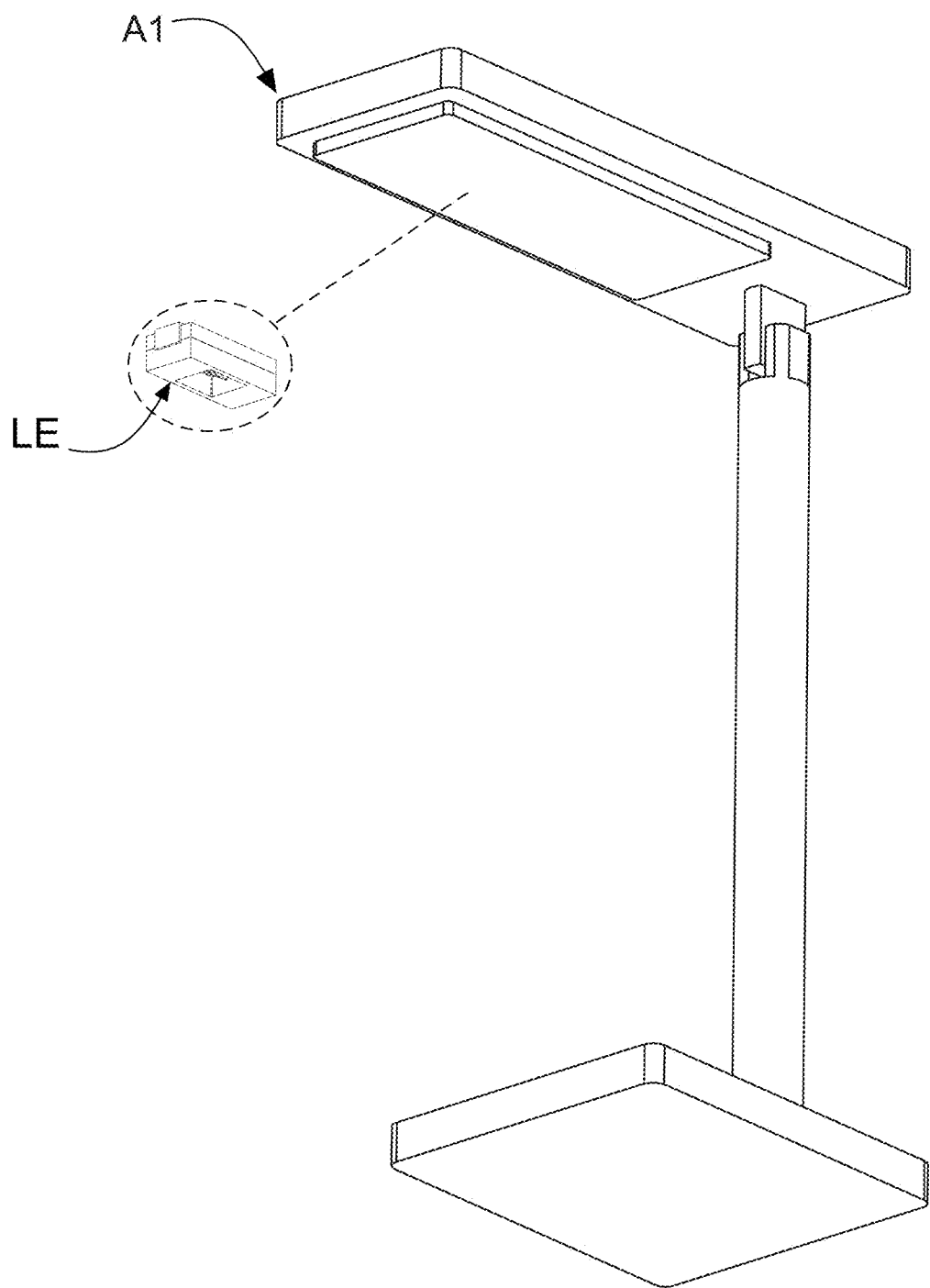
FIG. 9 shows a stereo diagram of one illumination apparatus using the forgoing white-light QLED component as its principal light source.
Figure 10:
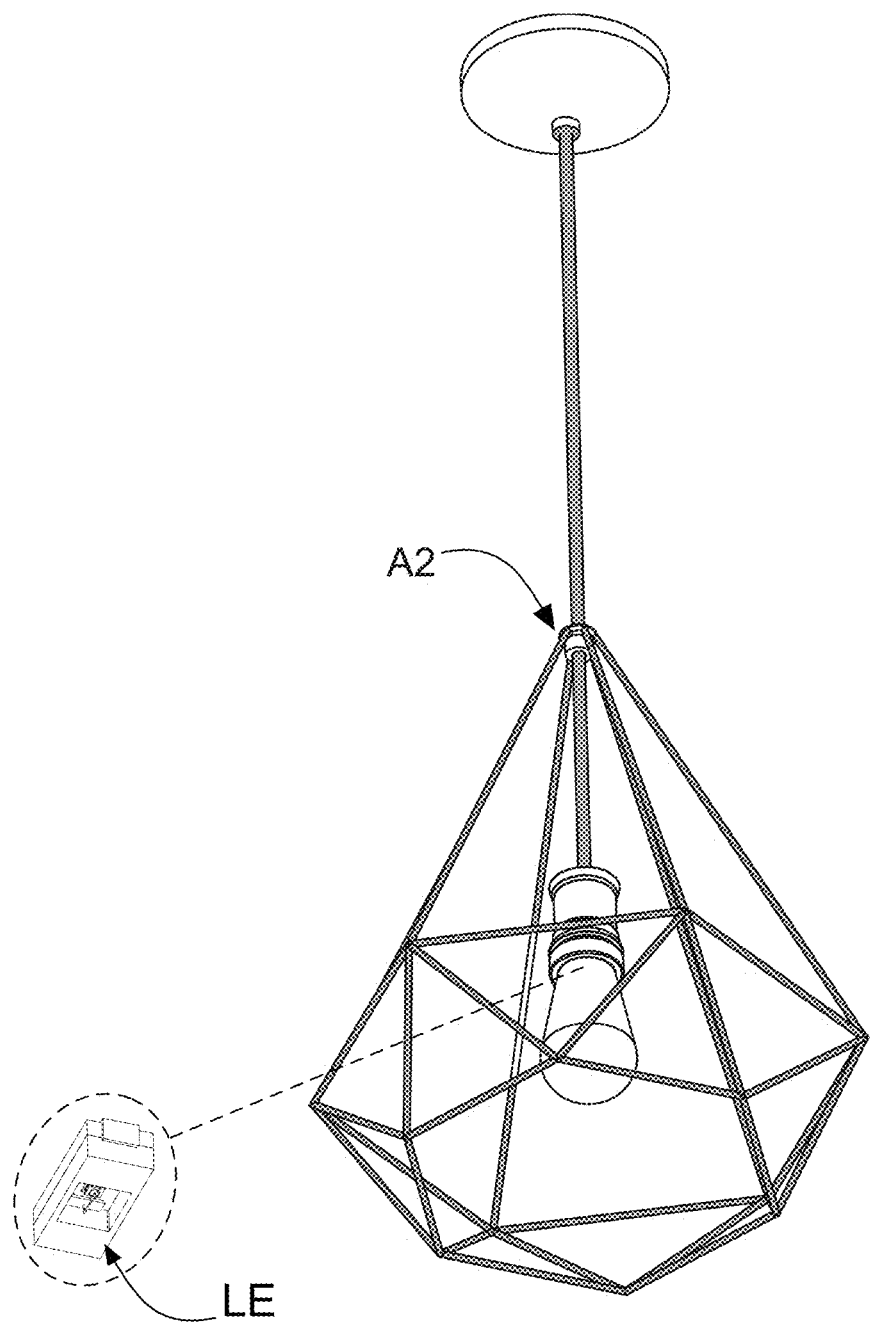
FIG. 10 shows a stereo diagram of another one illumination apparatus using the forgoing white-light QLED component as its principal light source.

FIG. 9 shows a stereo diagram of one illumination apparatus using the forgoing white-light QLED component LE as its principal light source, and FIG. 10 shows a stereo diagram of another one illumination apparatus also using the forgoing white-light QLED component LE as its principal light source. From FIG. 7 and FIG. 9, it is certainly known that the white-light QLED component LE of the present invention is taken as a lighting member and/or a light source for application in an illumination apparatus like a desk lamp A1 shown in FIG. 9. Moreover, FIG. 7 and FIG. 10 have revealed that, the white-light QLED component LE of the present invention can also be used as a lighting member and/or a light source for application in another one illumination apparatus like a pendant lamp A2 shown in FIG. 10. Briefly speaking, the white-light QLED component LE including the white-light QLED element 1 having the structure shown as FIG. 2 can be taken as a light source for application in various an illumination devices, including desk lamp, pendant lamp, modeling lamp, table lamp, night lamp, situation lamp, bulb lamp, and tube lamp.

Figure 11:
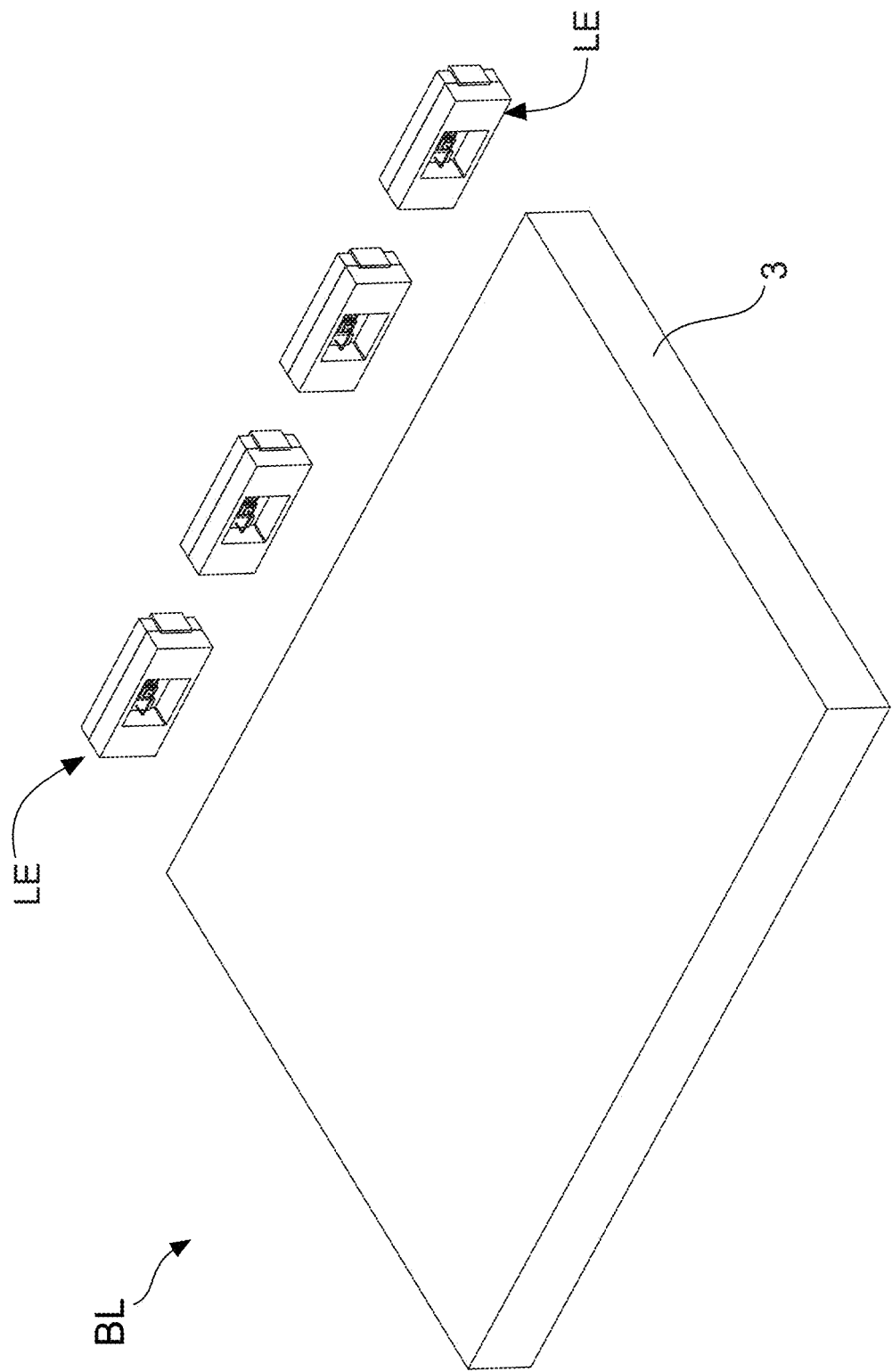
FIG. 11 shows a stereo diagram of a backlight module comprising a light guide plate and N number of the forgoing white-light QLED components.

With reference to FIG. 11, there is shown a stereo diagram of a backlight module comprising a light guide plate and N number of the forgoing white-light QLED components LE. In one practicable application, at least one the white-light QLED component LE and a light guide plate 3 can be assembled to form a backlight module BL, such that the backlight module BL can be further applied in a flat-plane display device. The flat-plane display device can be an independent device such as an LCD device. In addition, flat-plane display device can also be integrated in an electronic device like smart phone, tablet computer, laptop computer, all-in-one computer, video door-phone, or computer-implemented kiosk.

Second Embodiment of White-Light QLED Element

Figure 12:
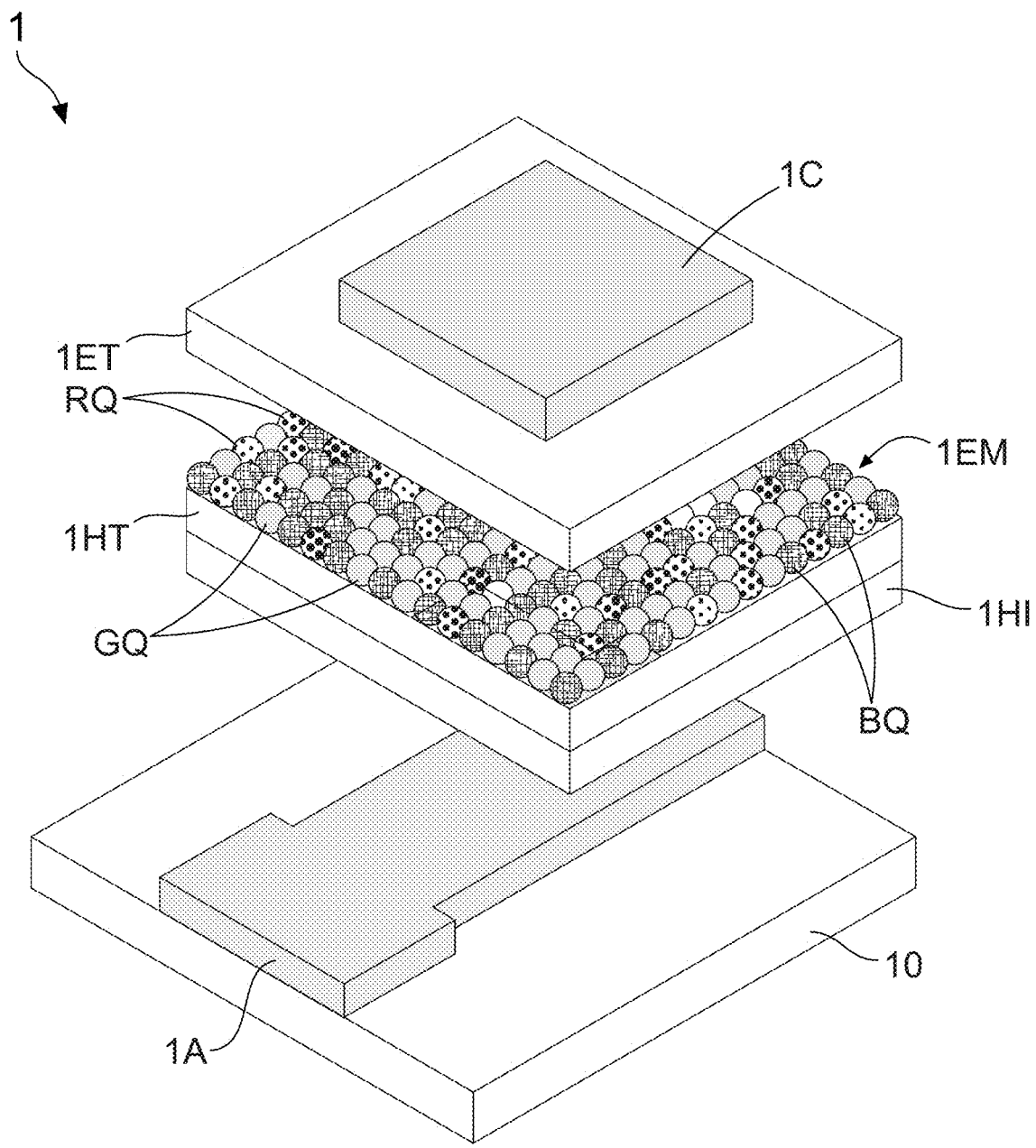
FIG. 12 shows an exploded view of the white-light QLED element according to the present invention.

With reference to FIG. 12, there is shown an exploded view of the white-light QLED element according to the present invention. In second embodiment, the white-light QLED element 1 is also designed to comprises: a transparent substrate 10, an anode layer 1A formed on the transparent substrate 10, a hole injection layer 1HI formed on the anode layer 1A, a hole transport layer 1HT formed on the hole injection layer 1HI, an emission layer 1EM formed on the hole transport layer 1HT, an electron transport layer 1ET, and a cathode layer 1C.

In the second embodiment, particularly, the emission layer 1EM formed between the hole transport layer 1HT and the electron transport layer 1ET is incorporated with a plurality of red quantum dots (QDs) RQ, a plurality of green QDs GQ, and a plurality of blue QDs BQ. It is worth further explaining that, a photoluminescence (PL) spectrum of the red QDs RQ reveals that a red light radiated from the red QDs RQ has a wavelength of 620±5 nm. Moreover, a PL spectrum of the green QDs GQ indicates that a green light emitted by the green QDs GQ has a wavelength of 520±5 nm. In addition, a PL spectrum of the blue QDs BQ indicates that a blue light emitted by the blue QDs BQ has a wavelength of 460±5 nm. According to the particular design of the present invention, the red QDs RQ, the green QDs GQ and the blue QDs BQ have a mixing ratio in a range between 2:1:3 and 3.8:1:5.5. In other words, the green QDs are contained in the emission layer 1EM by a content of 11-15%, the red QDs are contained in the emission layer 1EM by a content of 35-38%, and the blue QDs are contained in the emission layer 1EM has a content of 50-53%. By such design, the emission layer 1EM of the white-light QLED 1 would emit a white light after a bias voltage is applied between the anode layer 1A and the cathode layer 1C.

Figure 13:
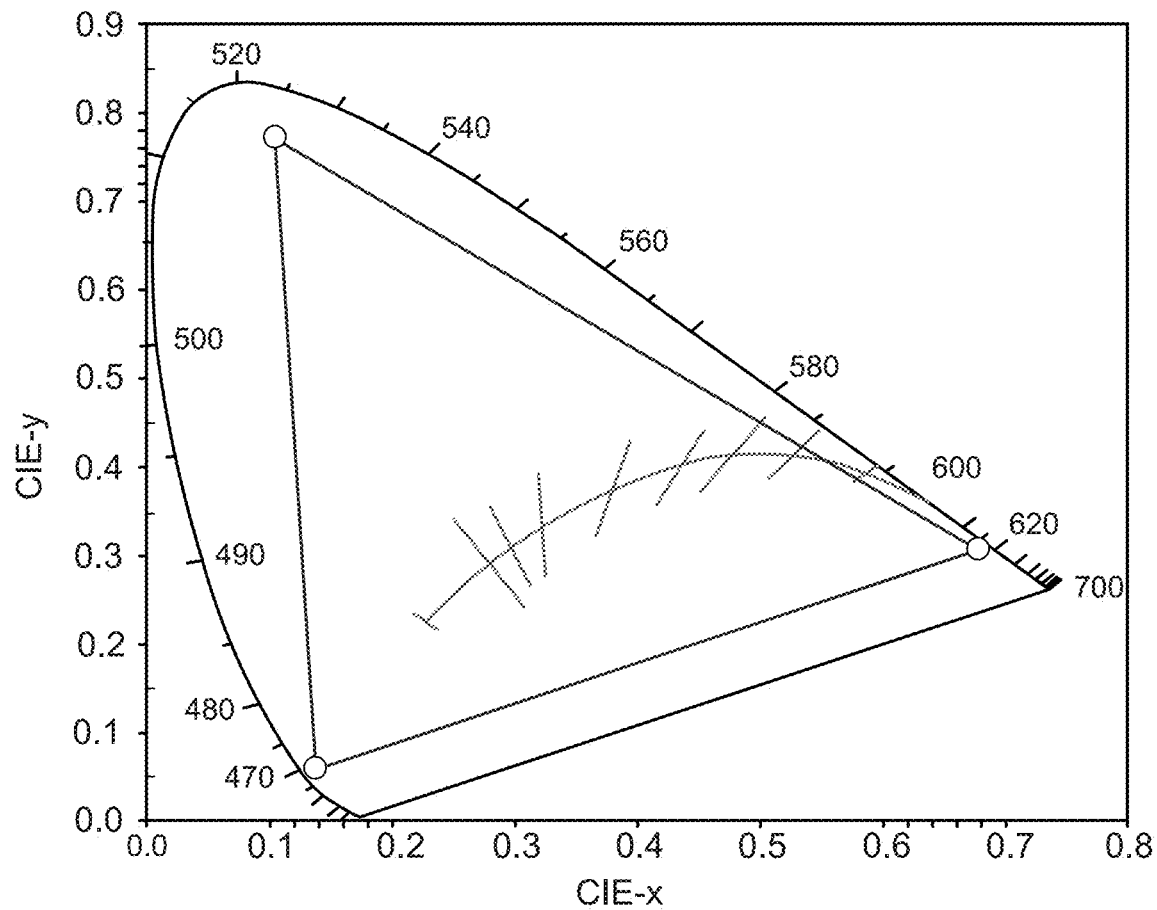
FIG. 13 shows a CIE 1931 chromaticity diagram for showing a color gamut of the white-light QLED element.

With reference to FIG. 13, there is shown a CIE 1931 chromaticity diagram for showing a color gamut of the white-light QLED element 1. It needs to explain that, a test sample of the white-light QLED element 1 is adopted for obtaining the measurement data of FIG. 13, wherein the emission layer 1EM of the test sample is designed to incorporated with the green QDs of 15%, the red QDs of 35% and the blue QDs of 56%. After applying a bias voltage between the anode layer 1A and the cathode layer 1C, the emission layer 1EM emits a white light that is mixed by a red light, a green light and a blue light. Moreover, CIE 1931 chromaticity diagram of FIG. 13 shows the chromaticity coordinates the red light, the green light and the blue light are (0.675, 0.31), (0.105, 0.775) and (0.129, 0.6), respectively. As a result, the color gamut of the white-light QLED element 1 can be easily calculated to 128% NTSC.

Third Embodiment of White-Light QLED Element

Figure 14:
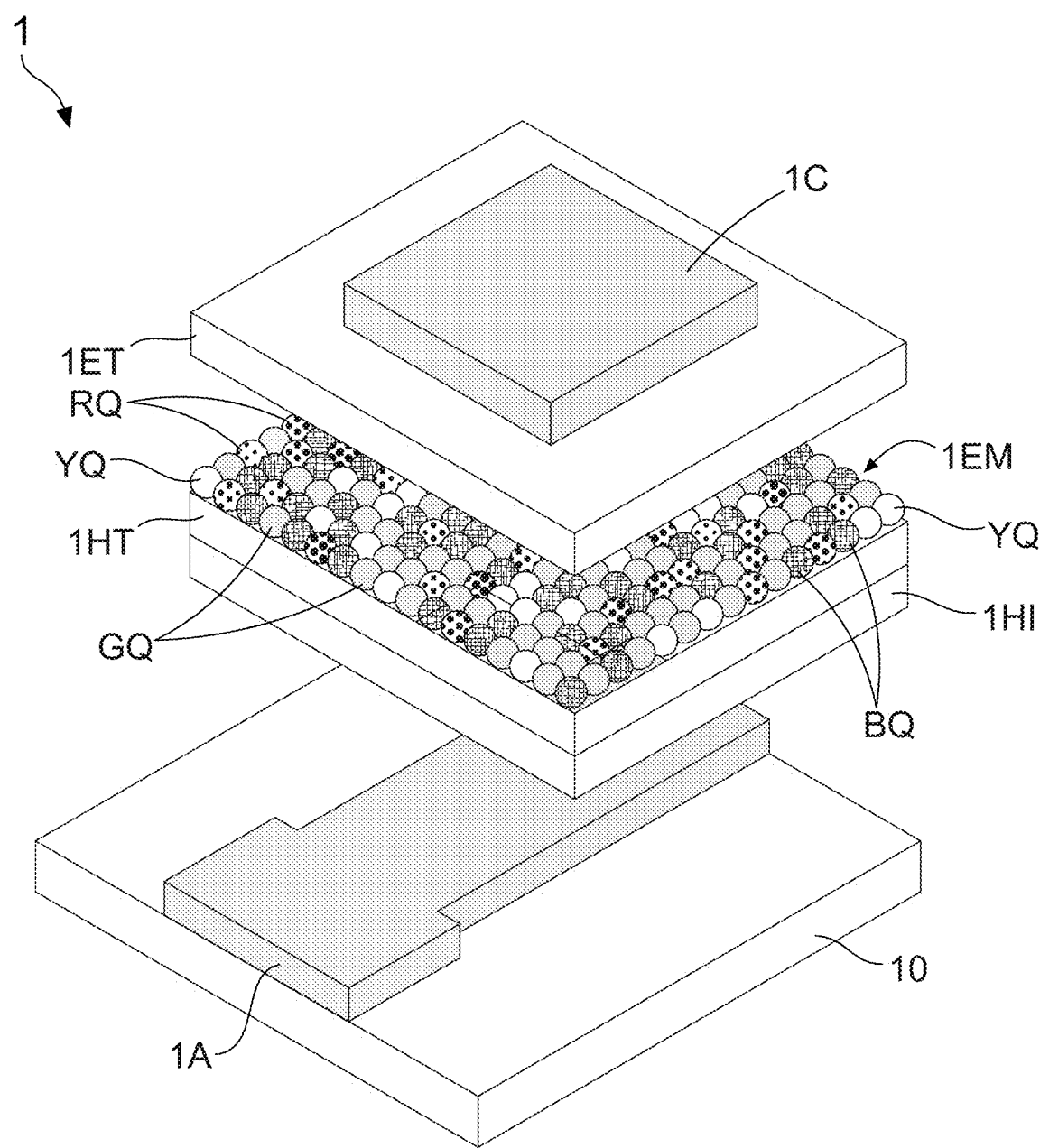
FIG. 14 shows an exploded view of the white-light QLED element according to the present invention.

With reference to FIG. 14, there is shown an exploded view of the white-light QLED element according to the present invention. In third embodiment, the white-light QLED element 1 is also designed to comprises: a transparent substrate 10, an anode layer 1A formed on the transparent substrate 10, a hole injection layer 1HI formed on the anode layer 1A, a hole transport layer 1HT formed on the hole injection layer 1HI, an emission layer 1EM formed on the hole transport layer 1HT, an electron transport layer 1ET, and a cathode layer 1C.

In the third embodiment, particularly, the emission layer 1EM formed between the hole transport layer 1HT and the electron transport layer 1ET is incorporated with a plurality of red quantum dots (QDs) RQ, a plurality of green QDs GQ, a plurality of blue QDs BQ, and a plurality of yellow QDs YQ. It is worth further explaining that, a photoluminescence (PL) spectrum of the red QDs RQ reveals that a red light radiated from the red QDs RQ has a wavelength of 620±5 nm, and a PL spectrum of the green QDs GQ indicates that a green light emitted by the green QDs GQ has a wavelength of 520±5 nm. Moreover, a PL spectrum of the blue QDs BQ indicates that a blue light emitted by the blue QDs BQ has a wavelength of 460±5 nm, and a PL spectrum of the yellow QDs YQ indicates that a yellow light emitted by the yellow QDs YQ has a wavelength of 550±5 nm.

According to the particular design of the present invention, the red QDs RQ, the green QDs GQ and the blue QDs BQ have a mixing ratio in a range between 2:1:3 and 3.8:1:5.5. Moreover, the yellow QDs YQ and the blue QDs BQ have a mixing ratio in a range between 1:4 and 1:8. For example, it is able to make the emission layer 1EM be incorporated with the yellow QDs of 8.8%, the red QDs of 30.6%, the green QDs of 10.6%, and the blue QDs of 50%.

Figure 15:
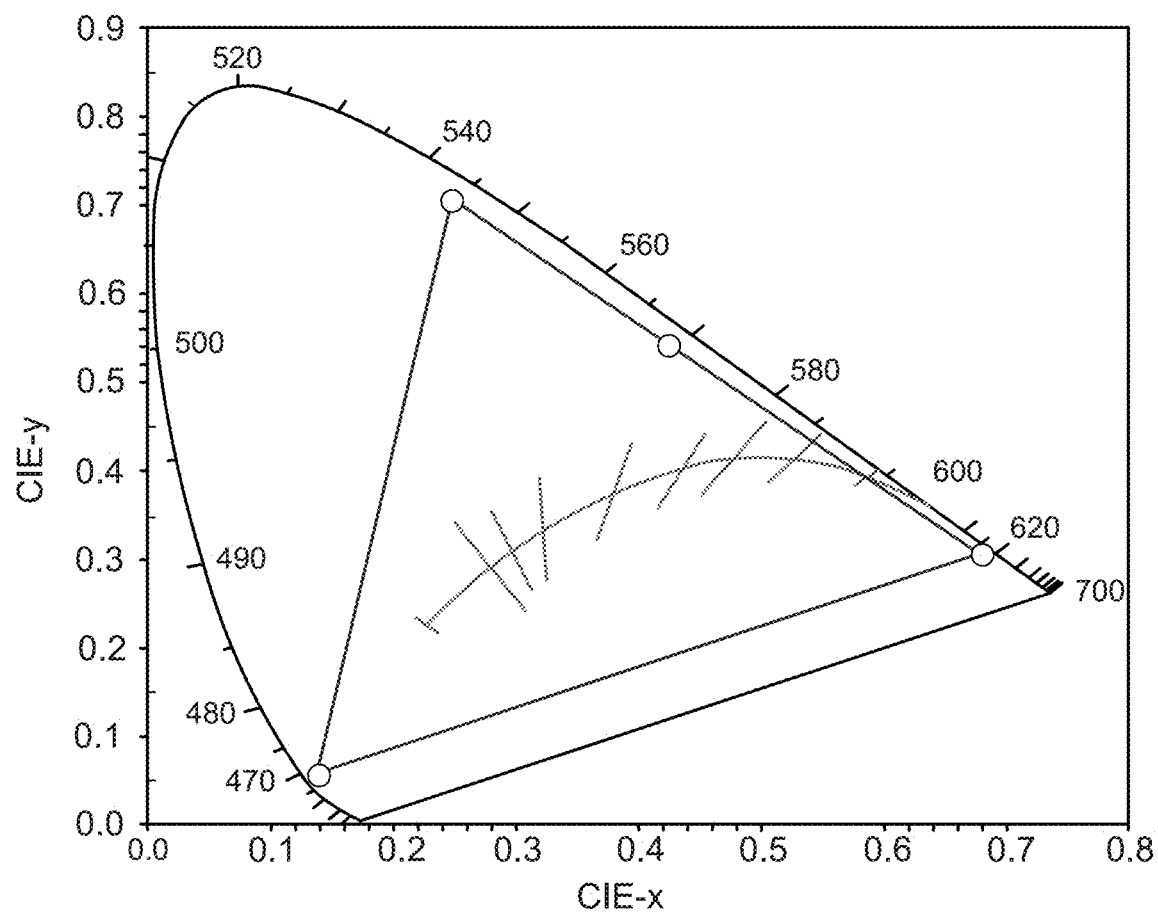
FIG. 15 shows a CIE 1931 chromaticity diagram for showing a color gamut of the white-light QLED element.

With reference to FIG. 15, there is shown a CIE 1931 chromaticity diagram for showing a color gamut of the white-light QLED element 1. It needs to explain that, a test sample of the white-light QLED element 1 is adopted for obtaining the measurement data of FIG. 15, wherein the emission layer 1EM of the test sample is designed to incorporated with the yellow QDs of 8.8%, the red QDs of 30.6%, the green QDs of 10.6%, and the blue QDs of 50%. After applying a bias voltage between the anode layer 1A and the cathode layer 1C, the emission layer 1EM emits a white light that is mixed by a red light, a green light, a blue light, and a yellow light. Moreover, CIE 1931 chromaticity diagram of FIG. 13 shows the chromaticity coordinates the red light, the green light and the blue light are (0.42, 0.54), (0.68, 0.31), (0.24, 0.72), and (0.14, 0.52), respectively. Therefore, experimental data have evidenced that, the white-light QLED element 1 of the present invention indeed exhibits an advantage of wide color gamut.

Therefore, through above descriptions, a white-light QLED component, a backlight module using the white-light QLED component, and an illumination apparatus using the white-light QLED component they are proposed by the present invention have been introduced completely and clearly. The above description is made on embodiments of the present invention. However, the embodiments are not intended to limit scope of the present invention, and all equivalent implementations or alterations within the spirit of the present invention still fall within the scope of the present invention.

What is claimed is:

1. A white-light QLED component, comprising:
a transparent substrate;
an anode layer, being formed on the transparent substrate;
a hole injection layer, being formed on the anode layer;
a hole transport layer, being formed on the hole injection layer;
an emission layer, being formed on the hole transport layer, and being incorporated with a plurality of yellow quantum dots (QDs) and a plurality of blue QDs; wherein the yellow QDs and the blue QDs have a first mixing ratio in a range between 1:4 and 1:8;
an electron transport layer, being formed on the emission layer; and
a cathode layer, being formed on the electron transport layer.

2. The white-light QLED component of claim 1, wherein a material for making the anode layer is selected from the group consisting of nickel (Ni), platinum (Pt), vanadium (V), chromium (Cr), copper (Cu), zinc (Zn), gold (Au), fluorine-doped tin oxide (FTO), indium tin oxide (ITO), zinc oxide (ZnO), ZnO-doped gallium oxide (ZnO—Ga$_2$O$_3$), alumina-doped zinc oxide (ZnO—Al$_2$O$_3$), and tin oxide (SnO).

3. The white-light QLED component of claim 1, wherein a material for making the hole injection layer is selected from the group consisting of poly(2,3-dihydrothieno-1,4-dioxin)-poly(styrenesulfonate) (PEDOT:PSS), poly-3-methylthiophene (PMeT), polypyrrole (PPy), and polyaniline (PANT).

4. The white-light QLED component of claim 1, wherein a material for making the hole transport layer is selected from the group consisting of molybdenum oxide (MoO$_3$), 2,2',7,7'-tetrakis[N,N-di(4-methoxyphenyl)amino]-9,9'-spirobifluorene (spiro-OMeTAD), poly(2,3-dihydrothieno-1,4-dioxin)-poly(styrenesulfonate) (PEDOT:PSS), N,N'-bis(3-methylphenyl)-N,N'-diphenylbenzidine (TPD), poly-TPD (PTPD), and poly(3-hexylthiophene-2,5-diyl) (P3HT).

5. The white-light QLED component of claim 1, wherein a material for making the electron transport layer is selected from the group consisting of zinc oxide (ZnO), titanium oxide (TiO$_2$), tris(8-hydroxyquinoline)aluminum (Alq3) and 2,2',2"-(1,3,5-Benzinetriyl)-tris(1-phenyl-1-H-benzimidazole) (TPBi).

6. The white-light QLED component of claim 1, wherein a material for making the cathode layer is selected from the group consisting of magnesium (Mg), calcium (Ca), titanium (Ti), indium (In), lithium (Li), aluminum (Al), silver (Ag), tin (An), compound of lithium fluoride (LiF) and (Al, and compound of LiF and Ca.

7. The white-light QLED component of claim 1, wherein the emission layer is further incorporated with a plurality of red QDs and a plurality of green QDs, and red QDs, the green QDs, and the blue QDs having a second mixing ratio in a range between 2:1:3 and 3.8:1:5.5.

8. The white-light QLED component of claim 1, further comprising:
a base;
a main body, being disposed on the base, and having an accommodation recess;
a first electrode unit, being embedded in the main body, and having a first electrical portion and a first welded portion; wherein the first electrical portion is exposed out of the main body through the accommodation recess, and the first welded portion being protruded so as to be exposed out of the main body; and
a second electrode unit, being embedded in the main body, and having a second electrical portion and a second welded portion; wherein the second electrical portion is exposed out of the main body through the accommodation recess, and the second welded portion being protruded so as to be exposed out of the main body;
wherein the anode layer is electrically connected to the first electrical portion, and the cathode layer being electrically connected to the second electrical portion.

9. The white-light QLED component of claim 8, wherein the white-light QLED component is a light source that included in an illumination apparatus.

10. The white-light QLED component of claim 8, wherein at least one of the white-light QLED component and a light guide plate are assembled to form a backlight module, and the backlight module is included in a flat-plane display device.

11. A white-light QLED component, comprising:
a transparent substrate;
an anode layer, being formed on the transparent substrate;
a hole injection layer, being formed on the anode layer;
a hole transport layer, being formed on the hole injection layer;
an emission layer, being formed on the hole transport layer, and being incorporated with a plurality of red quantum dots (QDs), a plurality of green QDs and a plurality of blue QDs; wherein the red QDs, the green QDs and the blue QDs have a first mixing ratio in a range between 2:1:3 and 3.8:1:5.5;

an electron transport layer, being formed on the emission layer; and a cathode layer, being formed on the electron transport layer.

12. The white-light QLED component of claim 11, wherein the emission layer is further incorporated with a plurality of yellow QDs, and the yellow QDs and the blue QDs having a second mixing ratio in a range between 1:4 and 1:8.

13. The white-light QLED component of claim 11, wherein a material for making the anode layer is selected from the group consisting of nickel (Ni), platinum (Pt), vanadium (V), chromium (Cr), copper (Cu), zinc (Zn), gold (Au), fluorine-doped tin oxide (FTO), indium tin oxide (ITO), zinc oxide (ZnO), ZnO-doped gallium oxide (ZnO—$Ga_2O_3$), alumina-doped zinc oxide (ZnO—$Al_2O_3$), and tin oxide (SnO).

14. The white-light QLED component of claim 11, wherein a material for making the hole injection layer is selected from the group consisting of poly(2,3-dihydrothieno-1,4-dioxin)-poly(styrenesulfonate) (PEDOT:PSS), poly-3-methylthiophene (PMeT), polypyrrole (PPy), and polyaniline (PANT).

15. The white-light QLED component of claim 11, wherein a material for making the hole transport layer is selected from the group consisting of molybdenum oxide ($MoO_3$), 2,2',7,7'-tetrakis[N,N-di(4-methoxyphenyl)amino]-9,9'-spirobifluorene (spiro-OMeTAD), poly(2,3-dihydrothieno-1,4-dioxin)-poly(styrenesulfonate) (PEDOT:PSS), N,N'-bis(3-methylphenyl)-N,N'-diphenylbenzidine (TPD), poly-TPD (PTPD), and poly(3-hexylthiophene-2,5-diyl) (P3HT).

16. The white-light QLED component of claim 11, wherein a material for making the electron transport layer is selected from the group consisting of zinc oxide (ZnO), titanium oxide ($TiO_2$), tris(8-hydroxyquinoline)aluminum (Alq3) and 2,2',2''-(1,3,5-Benzinetriyl)-tris(1-phenyl-1-H-benzimidazole) (TPBi).

17. The white-light QLED component of claim 11, wherein a material for making the cathode layer is selected from the group consisting of magnesium (Mg), calcium (Ca), titanium (Ti), indium (In), lithium (Li), aluminum (Al), silver (Ag), tin (An), compound of lithium fluoride (LiF) and (Al, and compound of LiF and Ca.

18. The white-light QLED component of claim 11, further comprising:

a base;

a main body, being disposed on the base, and having an accommodation recess;

a first electrode unit, being embedded in the main body, and having a first electrical portion and a first welded portion; wherein the first electrical portion is exposed out of the main body through the accommodation recess, and the first welded portion being protruded so as to be exposed out of the main body; and a second electrode unit, being embedded in the main body, and having a second electrical portion and a second welded portion; wherein the second electrical portion is exposed out of the main body through the accommodation recess, and the second welded portion being protruded so as to be exposed out of the main body;

wherein the anode layer is electrically connected to the first electrical portion, and the cathode layer being electrically connected to the second electrical portion.

19. The white-light QLED component of claim 11, wherein the white-light QLED component is a light source that included in an illumination apparatus.

20. The white-light QLED component of claim 11, wherein at least one of the white-light QLED component and a light guide plate are assembled to form a backlight module, and the backlight module is included in a flat-plane display device.

\* \* \* \* \*